(12) United States Patent  (10) Patent No.: US 8,798,567 B2
Yoneyama et al.  (45) Date of Patent: Aug. 5, 2014

(54) GAIN CONTROL CIRCUIT AND RECEIVING SYSTEM

(71) Applicant: Sony Corporation, Tokyo (JP)

(72) Inventors: Yusuke Yoneyama, Tokyo (JP); Noboru Sasho, Kanagawa (JP); Takeo Tokunaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/875,439

(22) Filed: May 2, 2013

(65) Prior Publication Data

US 2013/0303101 A1  Nov. 14, 2013

(30) Foreign Application Priority Data

May 9, 2012 (JP) .................. 2012-107313

(51) Int. Cl.
*H04B 1/06* (2006.01)
*H03G 3/20* (2006.01)
*H04B 17/00* (2006.01)

(52) U.S. Cl.
CPC ..................... *H03G 3/20* (2013.01)
USPC .................... 455/240.1; 455/250.1

(58) Field of Classification Search
CPC ....................................................... H03G 3/20
See application file for complete search history.

(56) References Cited

U.S. PATENT DOCUMENTS 7,382,166 B1 * 6/2008 Ide .................................. 327/62

FOREIGN PATENT DOCUMENTS

JP  60-000109 A  1/1985

* cited by examiner

*Primary Examiner* — Lee Nguyen
(74) *Attorney, Agent, or Firm* — Rader, Fishman & Grauer PLLC

(57) ABSTRACT

Disclosed herein is a gain control circuit including: an amplifying section configured to amplify an input voltage in such a manner that amplitude of an output voltage at an output terminal is kept constant; an allowable voltage acquirer configured to acquire an allowable voltage of an apparatus connected to the output terminal; a voltage divider configured to divide the output voltage according to a ratio between a maximum voltage of the amplified input voltage and the allowable voltage; and an adjusting section configured to further amplify the amplified input voltage according to the ratio and supply a resulting voltage to the output terminal.

8 Claims, 13 Drawing Sheets

| SIGNAL FORMAT | ALLOWABLE VOLTAGE (AC OFFSET VOLTAGE) | VOLTAGE DIVISION RATIO (MAXIMUM AMPLITUDE) |
|---|---|---|
| SINGLE OUTPUT | 2V | 1 (2Vpp) |
| SINGLE OUTPUT | 1V | 1/2 (1Vpp) |
| SINGLE OUTPUT | 0.6V | 1/3 (0.6Vpp) |
| DIFFERENTIAL OUTPUT | 1V | 1 (2Vpp) |
| DIFFERENTIAL OUTPUT | 0.5V | 1/2 (1Vpp) |
| DIFFERENTIAL OUTPUT | 0.3V | 1/3 (0.6Vpp) |

F I G . 1 2
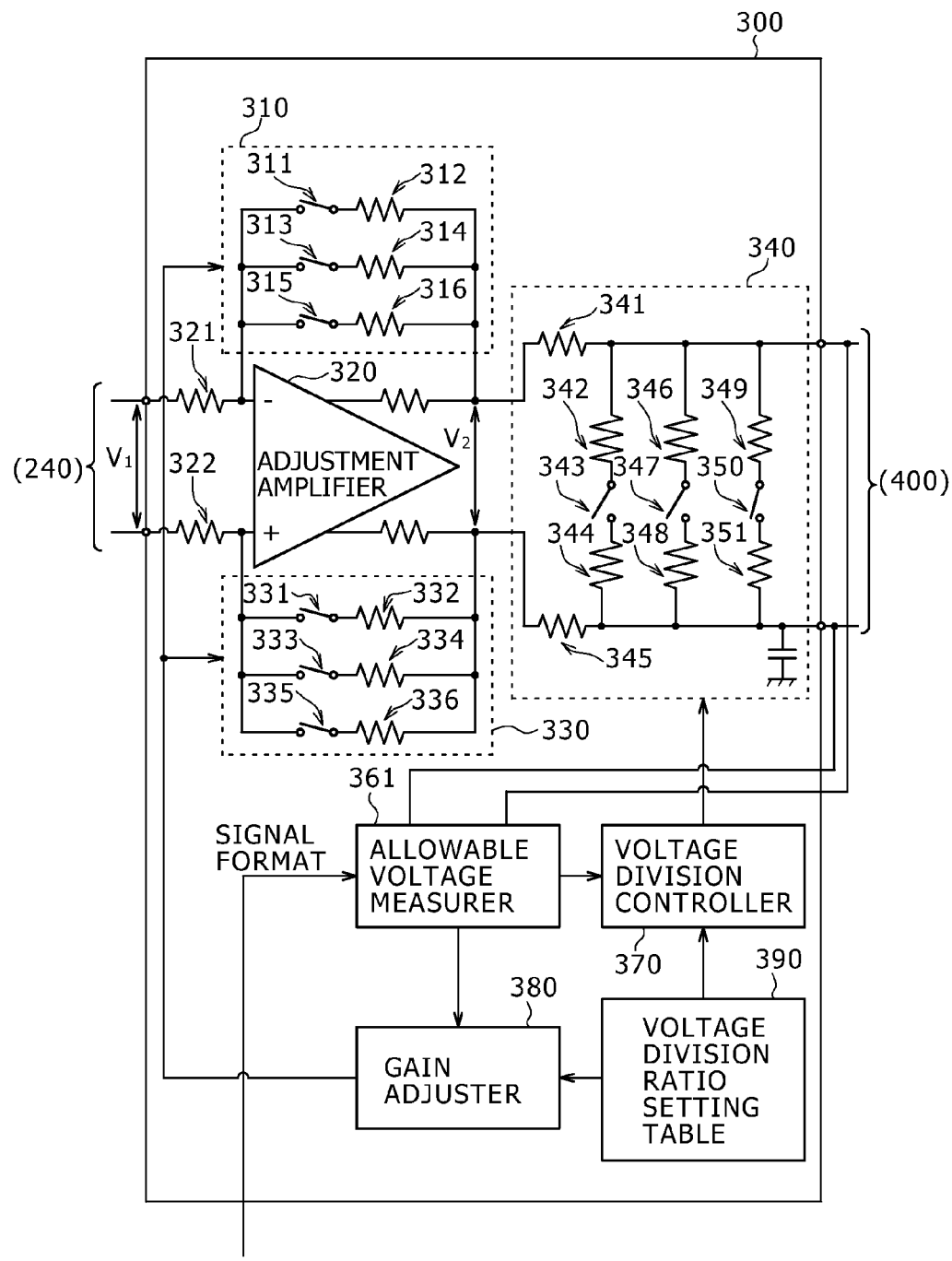

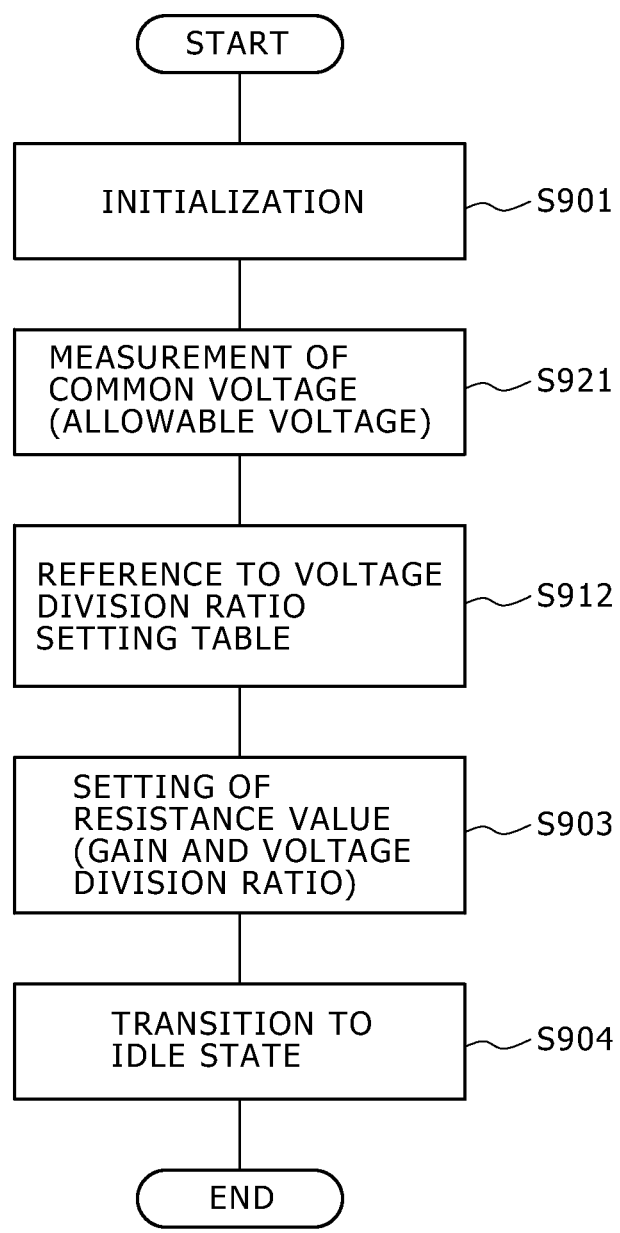

GAIN CONTROL CIRCUIT AND RECEIVING SYSTEM

BACKGROUND

The present technique relates to a gain control circuit and a receiving system. Specifically, it relates to a gain control circuit in a receiving device and a receiving system.

In an existing receiving device that receives ground waves and so forth, the level of a received signal is often unstable. Therefore, an auto gain control (AGC) function is frequently provided to amplify or attenuate the level of the received signal so that the level of an output signal may be kept constant. Such a receiving device supplies a signal controlled to a constant level to an apparatus such as a demodulating device. In this demodulating device or the like, generally an allowable voltage under which avoidance of malfunction and failure is ensured is lower when its size is smaller. In recent years, the allowable voltage of the apparatus tends to be low because size reduction thereof is being promoted particularly.

To protect such an apparatus, there has been proposed e.g. an amplifying circuit that performs voltage division of the amplitude of the output signal to limit the output voltage to at most the allowable voltage of the apparatus (refer to e.g. Japanese Patent Laid-open No. Sho 60-000109).

SUMMARY

However, the above-described amplifying circuit has a problem that a gain of the AGC using this amplifying circuit is lowered because performing voltage division of the amplitude of the output signal. Due to this, an operating point in the AGC changes. Here, the operating point means a condition under which control of the gain is started and is defined by e.g. the level of the received signal or a frequency of the received signal. The above-described amplifying circuit has a problem that it becomes impossible to properly control the level of the output signal if the operating point changes due to the voltage division.

The present technique has been made in view of the above circumstances and there is a need to protect an apparatus with keeping of the operating point.

According to an embodiment of the present technique, there is provided a gain control circuit including an amplifying section configured to amplify an input voltage in such a manner that the amplitude of an output voltage at an output terminal is kept constant, and an allowable voltage acquirer configured to acquire an allowable voltage of an apparatus connected to the output terminal. The gain control circuit further includes a voltage divider configured to divide the output voltage according to the ratio between the maximum voltage of the amplified input voltage and the allowable voltage, and an adjusting section configured to further amplify the amplified input voltage according to the ratio and supply a resulting voltage to the output terminal. This causes an effect that the output voltage is divided according to the ratio between the maximum voltage and the allowable voltage and the amplified input voltage is further amplified.

In this embodiment, the allowable voltage acquirer may measure the voltage of the output terminal as the allowable voltage. This causes an effect that the voltage of the output terminal is measured as the allowable voltage.

In this embodiment, the gain control circuit may further include a table configured to retain the allowable voltage and the ratio in association with each other, and the voltage divider may read out the ratio corresponding to the acquired allowable voltage from the table and divide the output voltage according to the ratio. This causes an effect that the output voltage is divided according to the ratio read out from the table that retains the allowable voltage and the ratio in association with each other.

In this embodiment, the table may further retain a signal format indicating whether or not the output voltage is a voltage of a differential output signal in association with the allowable voltage and the ratio, and the voltage divider may read out the ratio corresponding to the signal format and the allowable voltage. This causes an effect that the ratio corresponding to the signal format and the allowable voltage is read out.

In this embodiment, the voltage divider may divide the output voltage by insertion of a resistor. This causes an effect that the output voltage is divided by the insertion of the resistor.

In this embodiment, the adjusting section may include an adjustment amplifier that amplifies the amplified input voltage, and a gain adjuster that adjusts the gain of the adjustment amplifier by changing a resistance value of a resistor connected to the adjustment amplifier according to the ratio. This causes an effect that the gain of the adjustment amplifier is adjusted by changing the resistance value of the resistor connected to the adjustment amplifier according to the ratio.

According to another embodiment of the present technique, there is provided a receiving device including an amplifying section configured to amplify an input voltage in such a manner that the amplitude of an output voltage at an output terminal is kept constant, and an allowable voltage acquirer configured to acquire an allowable voltage of an apparatus connected to the output terminal. The receiving device further includes a voltage divider configured to divide the output voltage according to the ratio between the maximum voltage of the amplified input voltage and the allowable voltage, and an adjusting section configured to further amplify the amplified input voltage according to the ratio and supply a resulting voltage to the output terminal.

According to a further embodiment of the present technique, there is provided a receiving system including a gain control circuit configured to include an amplifying section that amplifies an input voltage on which a received signal is superimposed in such a manner that the amplitude of an output voltage at an output terminal is kept constant in response to input of the input voltage, and an allowable voltage acquirer that acquires an allowable voltage of an apparatus connected to the output terminal. The gain control circuit further includes a voltage divider that divides the output voltage according to the ratio between the maximum voltage of the amplified input voltage and the allowable voltage, and an adjusting section that further amplifies the amplified input voltage according to the ratio and supplies a resulting voltage to the output terminal. The receiving system further includes a signal processing device configured to process the received signal superimposed on the output voltage. This causes an effect that the output voltage is divided according to the ratio between the maximum voltage and the allowable voltage and the amplified input voltage is further amplified.

The embodiments of the present technique can provide an excellent effect that an apparatus can be protected with keeping of the operating point.

BRIEF DESCRIPTION OF THE DRAWINGS

FIG. 5 is a diagram showing one example of a voltage division ratio setting table in the first embodiment;

FIG. 12 is a block diagram showing one configuration example of an amplitude limiter in a fourth embodiment; and FIG. 13 is a flowchart showing one example of initial setting processing of a receiving system in the fourth embodiment.

DETAILED DESCRIPTION OF THE PREFERRED EMBODIMENTS

Modes for carrying out the present technique (hereinafter, referred to as embodiments) will be described below. The description will be made in the following order.

1. First Embodiment (example in which voltage division is performed according to the ratio between a set allowable voltage and a maximum voltage)
2. Second Embodiment (example in which voltage division is performed according to the ratio between an allowable voltage input from a demodulating device and a maximum voltage)
3. Third Embodiment (example in which a voltage of a single output signal is divided according to the ratio between an allowable voltage and a maximum voltage)
4. Fourth Embodiment (example in which voltage division is performed according to the ratio between a measured allowable voltage and a maximum voltage)

<1. First Embodiment>
[Configuration Example of Receiving System]

Figure 1:
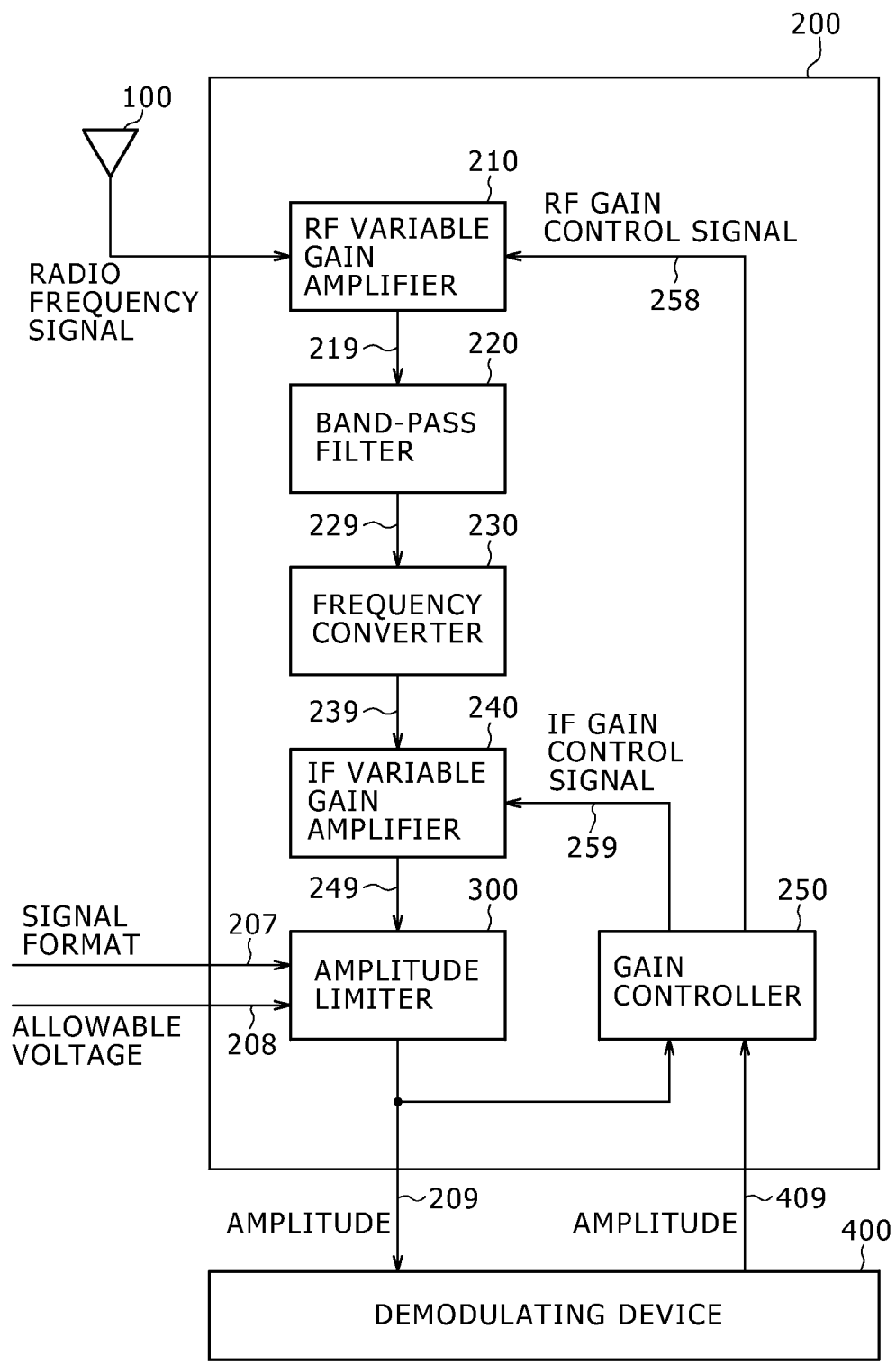
FIG. 1 is a block diagram showing one configuration example of a receiving system in a first embodiment.

FIG. 1 is a block diagram showing one configuration example of a receiving system according to an embodiment. This receiving system is a system configured to receive a radio frequency (RF) signal such as ground waves and satellite waves. The receiving system includes an antenna 100, a receiving device 200, and a demodulating device 400.

The antenna 100 receives the RF signal such as ground waves. The antenna 100 supplies the received RF signal to the receiving device 200.

The receiving device 200 includes an RF variable gain amplifier 210, a band-pass filter 220, a frequency converter 230, an IF variable gain amplifier 240, a gain controller 250, and an amplitude limiter 300.

The RF variable gain amplifier 210 amplifies the RF signal in accordance with control by the gain controller 250. Specifically, the RF variable gain amplifier 210 changes a gain in the amplification in accordance with control by the gain controller 250. The gain is defined by the following Expression 1 for example. The unit of gain is e.g. decibel (dB).

$$G = 20 \times \log_{10}(V_{out}/V_{in})$$  Expression 1

In Expression 1, G is the gain. $V_{in}$ is an input voltage of the RF variable gain amplifier 210 (i.e. a voltage of the RF signal). $V_{out}$ is an output voltage from the RF variable gain amplifier 210. The RF variable gain amplifier 210 outputs the amplified RF signal to the band-pass filter 220 via a signal line 219.

The band-pass filter 220 allows the passage of a signal in a specific frequency band therethrough. The band-pass filter 220 allows the passage of a signal in e.g. an ultra high frequency (UHF) band and supplies it to the frequency converter 230 via a signal line 229.

The frequency converter 230 converts a frequency of the RF signal. The frequency converter 230 converts the frequency of the RF signal to a comparatively low frequency that permits demodulation by the demodulating device 400, for example. The frequency converter 230 supplies the converted signal to the IF variable gain amplifier 240 via a signal line 239 as an IF signal.

The IF variable gain amplifier 240 amplifies the IF signal in accordance with control by the gain controller 250. Specifically, the IF variable gain amplifier 240 changes a gain in an amplification in accordance with control by the gain controller 250. The IF variable gain amplifier 240 outputs the amplified IF signal to the amplitude limiter 300 via a signal line 249. The RF variable gain amplifier 210 and the IF variable gain amplifier 240 are one example of an amplifying section set forth in the claims.

The gain controller 250 controls the gain of the RF variable gain amplifier 210 and the IF variable gain amplifier 240. For example, based on an amplitude of a signal output from the amplitude limiter 300 or the demodulating device 400, the gain controller 250 determines the gain of each of the RF variable gain amplifier 210 and the IF variable gain amplifier 240 in such a manner that the amplitude of this signal is kept constant. This realizes the AGC function. The gain controller 250 supplies an RF gain control signal adapted to control to the determined gain to the RF variable gain amplifier 210 via a signal line 258. The gain controller 250 supplies an IF gain control signal adapted to control to the determined gain to the IF variable gain amplifier 240 via a signal line 259.

The amplitude limiter 300 limits the amplitude of the output signal from the receiving device 200 based on a signal format and an allowable voltage. Here, the signal format indicates whether the output signal is a differential output signal or a single output signal. The allowable voltage is a voltage under which malfunction and failure do not occur in the demodulating device 400 and is a permitted value as an offset direct current (DC) voltage of an alternating current (AC) voltage. The signal format and the allowable voltage are set by an operator in advance.

Specifically, the amplitude limiter 300 limits the amplitude of the output signal so that a maximum value of the voltage of the output signal may be prevented from surpassing the allowable voltage. The amplitude limiter 300 amplifies the IF signal from the IF variable gain amplifier 240 by a factor corresponding to the gain lowered by the limitation. The amplitude limiter 300 supplies the limited output signal to the demodulating device 400 via a signal line 209. The receiving device 200 is one example of a gain control circuit set forth in the claims.

The demodulating device 400 demodulates a signal superimposed on the IF signal output from the receiving device 200 to e.g. a baseband signal. The demodulating device 400 supplies the amplitude of the output signal to the gain controller 250 via a signal line 409. The demodulating device 400 is one example of a signal processing device set forth in the claims.

[Configuration Example of Frequency Converter]

Figure 2:
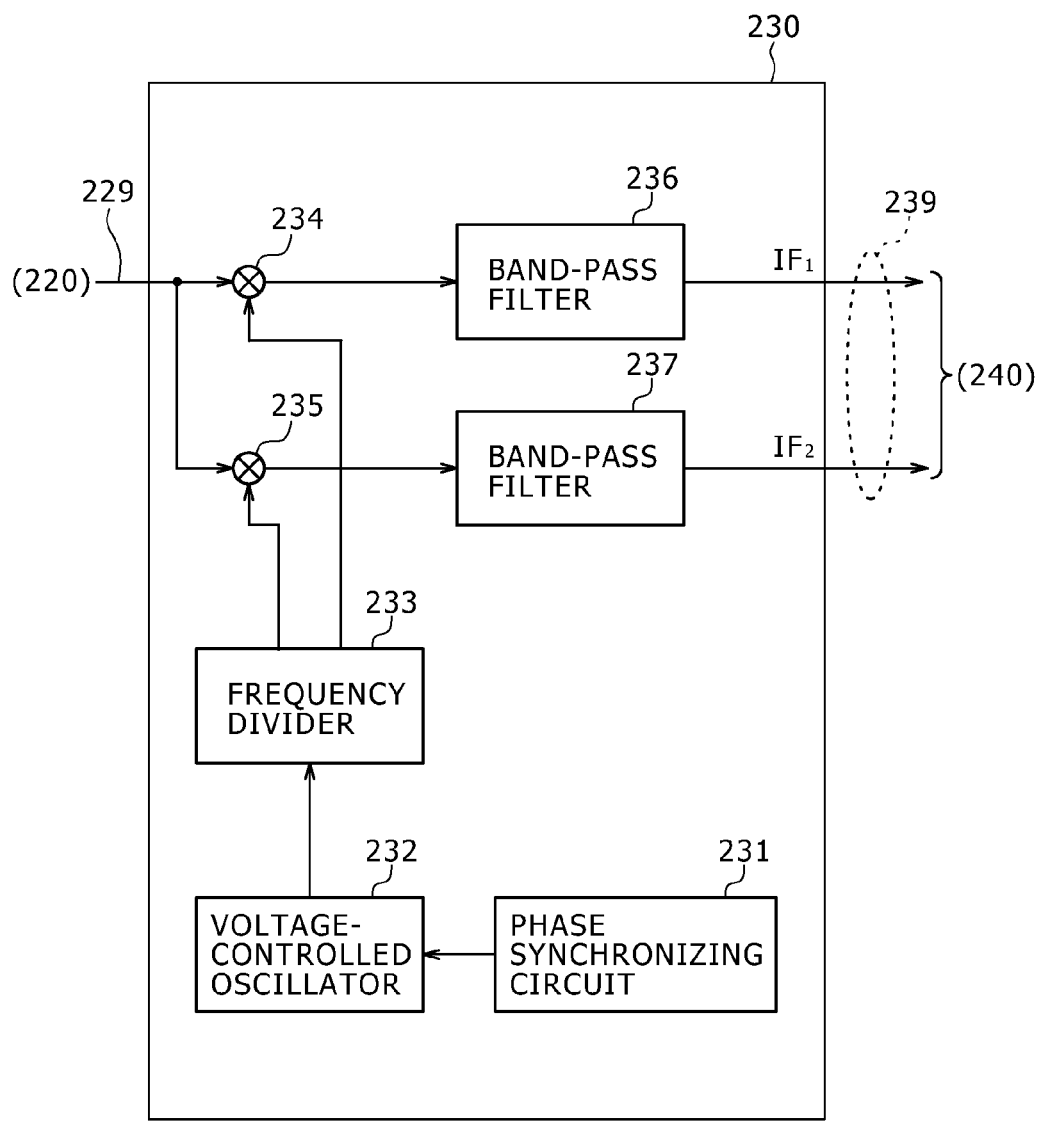
FIG. 2 is a block diagram showing one configuration example of a frequency converter in the first embodiment.

FIG. 2 is a block diagram showing one configuration example of the frequency converter 230 in the first embodiment. This frequency converter 230 includes a phase synchronizing circuit 231, a voltage-controlled oscillator 232, a frequency divider 233, mixers 234 and 235, and band-pass filters 236 and 237.

The phase synchronizing circuit 231 generates a signal synchronized with the phase of a predetermined reference signal. The phase synchronizing circuit 231 supplies the generated signal to the voltage-controlled oscillator 232.

The voltage-controlled oscillator 232 generates a signal whose frequency is controlled by a control voltage. The voltage-controlled oscillator 232 supplies the generated signal to the frequency divider 233.

The frequency divider 233 divides the frequency of the signal from the voltage-controlled oscillator 232 with a predetermined frequency division ratio. The frequency divider 233 outputs the frequency-divided signal to the mixers 234 and 235 as a local oscillation signal.

The mixers 234 and 235 convert the frequency of the RF signal by mixing the RF signal from the band-pass filter 220 with the local oscillation signal from the frequency divider 233. For example, one of the mixers 234 and 235 outputs a signal having a frequency equal to the sum of the frequency of the RF signal and the frequency of the local oscillation signal. The other outputs a signal having a frequency equal to the difference of them. The mixers 234 and 235 output these signals to the band-pass filters 236 and 237, respectively, as IF signals IF' and $IF_2$ that can be differentially output.

The band-pass filters 236 and 237 allow the passage of a signal in a specific frequency band therethrough. For example, the band-pass filters 236 and 237 suppress interfering waves leading to signal quality deterioration.

Figure 3:
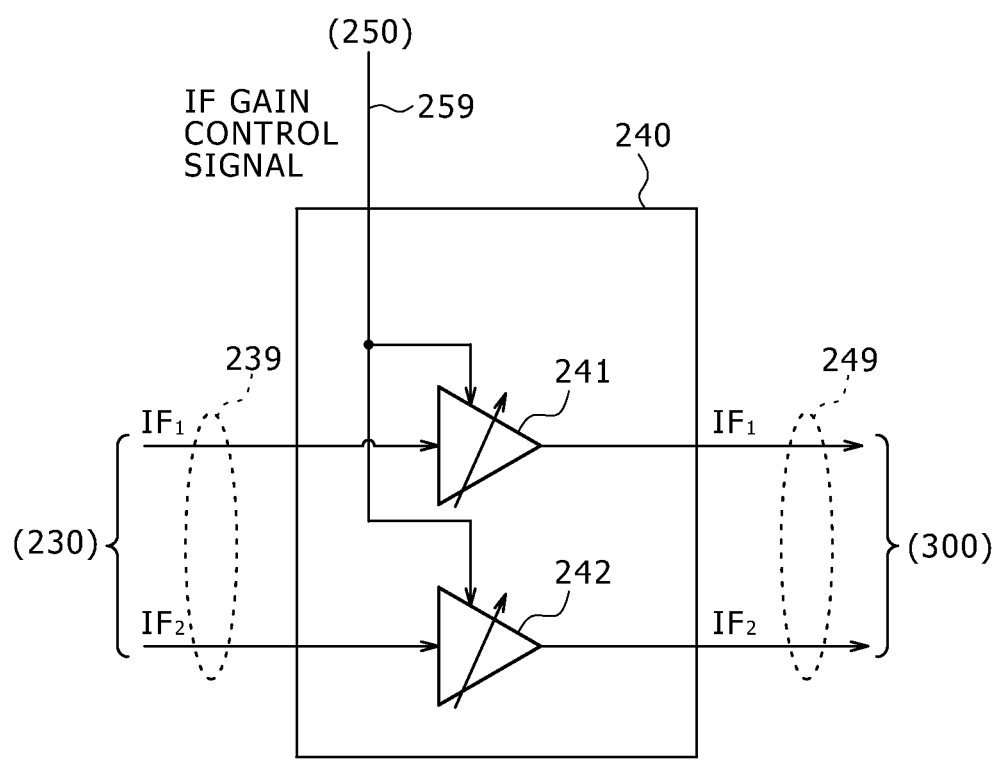
FIG. 3 is a block diagram showing one configuration example of an intermediate frequency (IF) variable gain amplifier in the first embodiment.

FIG. 3 is a block diagram showing one configuration example of the IF variable gain amplifier 240 in the first embodiment. The IF variable gain amplifier 240 includes differential IF variable gain amplifiers 241 and 242. The differential IF variable gain amplifiers 241 and 242 amplify the IF signals $IF_1$ and $IF_2$, respectively, in accordance control by the gain controller 250.

[Configuration Example of Amplitude Limiter]

Figure 4:
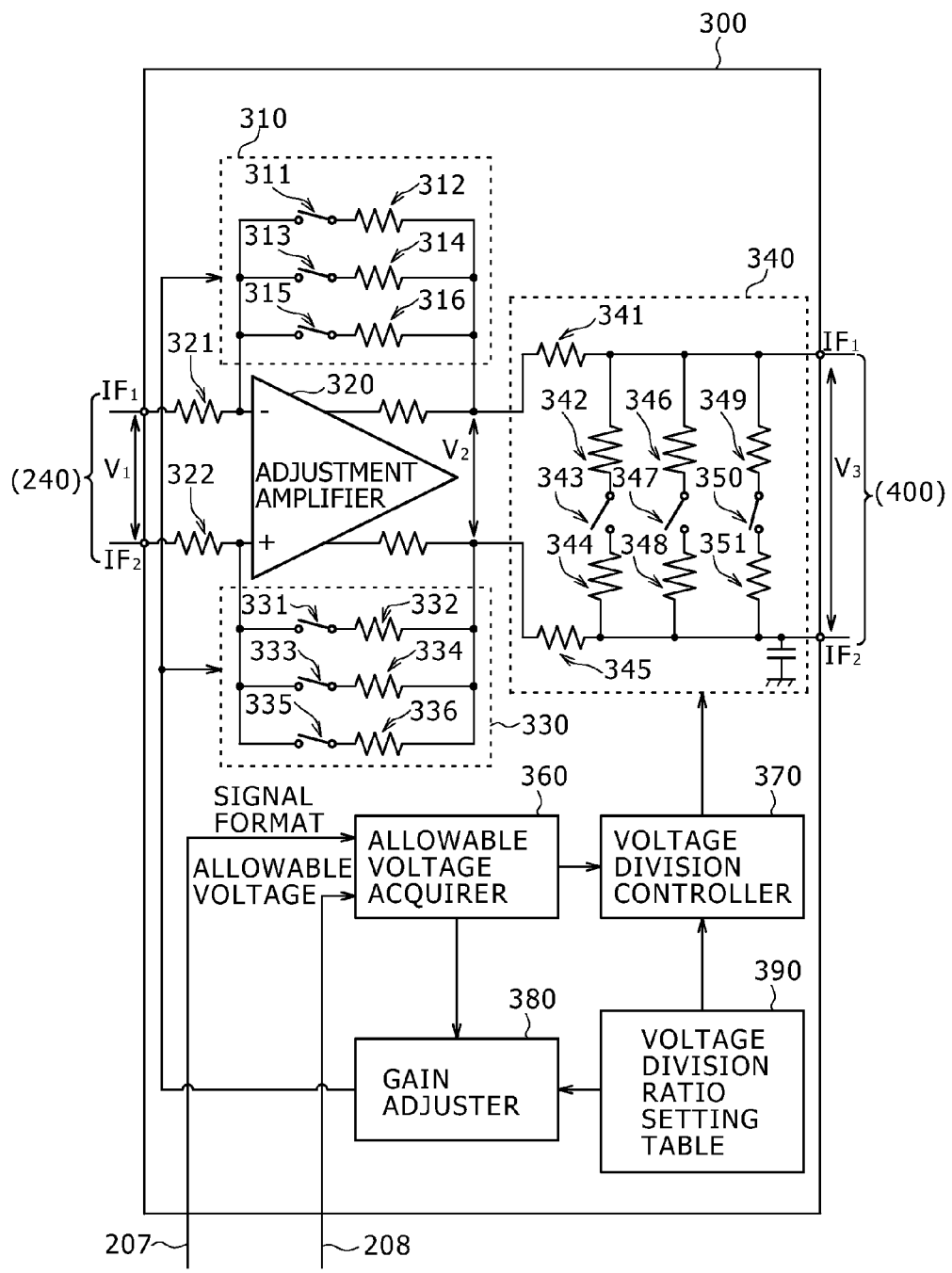
FIG. 4 is a block diagram showing one configuration example of an amplitude limiter in the first embodiment.

FIG. 4 is a block diagram showing one configuration example of the amplitude limiter 300 in the first embodiment. This amplitude limiter 300 includes gain adjusting circuits 310 and 330, resistors 321 and 322, an adjustment amplifier 320, a voltage dividing circuit 340, an allowable voltage acquirer 360, a voltage division controller 370, a gain adjuster 380, and a voltage division ratio setting table 390.

The gain adjusting circuit 310 is a circuit connected in parallel to an inverting input (−) terminal of the adjustment amplifier 320 and is controlled by the gain adjuster 380 to adjust the gain of the adjustment amplifier 320. This gain adjusting circuit 310 includes switches 311, 313, and 315 and resistors 312, 314, and 316. These switches 311, 313, and 315 have an input terminal and an output terminal and open/close channels between these terminals in accordance with control by the gain adjuster 380. The switch 311 and the resistor 312 are connected in series and the switch 313 and the resistor 314 are also connected in series. The switch 315 and the resistor 316 are also connected in series. The switch 311 and the resistor 312 are connected in parallel to the inverting input (−) terminal of the adjustment amplifier 320. Each of the group of the switch 313 and the resistor 314 and the group of the switch 315 and the resistor 316 is connected in parallel to the inverting input (−) terminal of the adjustment amplifier 320.

The adjustment amplifier 320 amplifies the IF signals amplified by the IF variable gain amplifier 240. The resistor 321 is connected to the inverting input (−) terminal of the adjustment amplifier 320 and the IF signal $IF_1$ is input to this terminal via this resistor 321. The resistor 322 is connected to a non-inverting input (+) terminal of the adjustment amplifier 320 and the IF signal $IF_2$ is input to this terminal via this resistor 322.

Here, the potential difference between the IF signals $IF_1$ and $IF_2$ is defined as $V_1$ and the potential difference between the output terminals of the adjustment amplifier 320 is defined as $V_2$. The resistance of each of the resistors 321 and 322 is defined as $R_1$ and the combined resistance of each of the gain adjusting circuits 310 and 330 is defined as $R_2$. In this case, the following Expression 2 holds among these parameters.

$$V_2 = V_1 \times (R_2/R_1) \quad \text{Expression 2}$$

According to Expression 2, the gain of the adjustment amplifier 320 can be changed by controlling the switches to change the combined resistance $R_2$ in each of the gain adjusting circuits 310 and 330. For example, if $R_1$ is 10 (kΩ) and $R_2$ is 20 (kΩ), $V_2/V_1=2$ is satisfied and a gain of 6 dB is obtained.

Although the amplitude limiter 300 adjusts the gain by control of the resistance $R_2$, it is also possible to insert a circuit allowing control of the resistance instead of the resistors 321 and 322 and adjust the gain by control of the resistance $R_1$. Alternatively, the amplitude limiter 300 may adjust the gain by control of both $R_1$ and $R_2$.

The gain adjusting circuit 330 is a circuit connected in parallel to the non-inverting input (+) terminal of the adjustment amplifier 320 and is controlled by the gain adjuster 380 to adjust the gain of the adjustment amplifier 320. This gain adjusting circuit 330 includes switches 331, 333, and 335 and resistors 332, 334, and 336. These switches 331, 333, and 335 have an input terminal and an output terminal and open/close channels between these terminals in accordance with control by the gain adjuster 380. The switch 331 and the resistor 332 are connected in series and the switch 333 and the resistor 334 are also connected in series. The switch 335 and the resistor 336 are also connected in series. The switch 331 and the resistor 332 are connected in parallel to the non-inverting input (+) terminal of the adjustment amplifier 320. Each of the group of the switch 333 and the resistor 334 and the group of the switch 335 and the resistor 336 is connected in parallel to the non-inverting input (+) terminal of the adjustment amplifier 320.

The voltage dividing circuit 340 includes resistors 341, 342, 344, 345, 346, 348, 349, and 351 and switches 343, 347, and 350. One end of the resistor 341 is connected to one of the output terminals of the adjustment amplifier 320 and the other end is connected to an output terminal of the amplitude limiter 300. One end of the resistor 345 is connected to the other of the output terminals of the adjustment amplifier 320 and the other end is connected to the output terminal of the amplitude limiter 300.

The resistor 342, the switch 343, and the resistor 344 are connected in series to each other and the resistor 346, the switch 347, and the resistor 348 are also connected in series. The resistor 349, the switch 350, and the resistor 351 are also connected in series. One end of the circuit having the resistor 342, the switch 343, and the resistor 344 is connected to the resistor 341 and the other end is connected to the resistor 345. Also regarding the circuit having the resistor 346, the switch 347, and the resistor 348 and the circuit having the resistor 349, the switch 350, and the resistor 351, one end is connected to the resistor 341 and the other end is connected to the resistor 345.

The output voltage $V_2$ of the adjustment amplifier 320 is divided by control of the switches 343, 347, and 350 in the voltage dividing circuit 340. For example, if the resistance of the resistors 341 and 345 is defined as $R_3$ and the resistance of the resistors 342 and 344 is defined as $R_4$, the output voltage $V_2$ is divided with a voltage division ratio of $R_3/(R_3+R_4)$ by controlling only the switch 343 to a closed-state. The divided output voltage is defined as $V_3$. For example, if $R_3$ and $R_4$ are 10 (kΩ), $V_2$ is divided with a voltage division ratio of 1/2. As a result, $V_3$ becomes half $V_2$ and a gain of −6 dB is obtained.

The allowable voltage acquirer 360 acquires the signal format and the allowable voltage. The allowable voltage acquirer 360 supplies these signal format and allowable voltage to the voltage division controller 370 and the gain adjuster 380.

The voltage division ratio setting table 390 is a table storing voltage division ratios in association with combinations of the signal format and the allowable voltage. The voltage division ratio is so set that a maximum value of the output voltage $V_3$ does not surpass the allowable voltage.

The voltage division controller 370 controls the voltage dividing circuit 340. Specifically, the voltage division controller 370 reads out, from the voltage division ratio setting table 390, the voltage division ratio corresponding to the signal format and the allowable voltage acquired by the allowable voltage acquirer 360. Then, the voltage division controller 370 controls each of the switches in the voltage dividing circuit 340 in such a manner that $V_3/V_2$ becomes equal to this voltage division ratio. Because the voltage division ratio is set to such a ratio that the maximum value of the output voltage $V_3$ does not surpass the allowable voltage as described above, output of a voltage higher than the allowable voltage is avoided. In particular, when the receiving device 200 is connected to the demodulating device 400 whose power is activated or when the power of the connected demodulating device 400 is activated, possibly it is impossible to follow the voltage at the time of the power activation by only control by the AGC. However, the demodulating device 400 can be protected by dividing the output voltage in advance. The voltage dividing circuit 340 and the voltage division controller 370 are one example of a voltage divider set forth in the claims.

The gain adjuster 380 controls the gain adjusting circuits 310 and 330. Specifically, the gain adjuster 380 reads out, from the voltage division ratio setting table 390, the voltage division ratio corresponding to the signal format and the allowable voltage acquired by the allowable voltage acquirer 360. Then, the gain adjuster 380 controls each of the switches in the gain adjusting circuits 310 and 330 in such a manner that $V_1/V_2$ becomes equal to this voltage division ratio. Due to this, the voltage $V_1$ of the IF signal is amplified by a factor corresponding to the lowering of the gain due to the voltage division. Therefore, the gain of the whole of the receiving device 200 has the same value as that before the voltage division. For example, if the voltage division ratio is 1/2 (−6 dB), the gain adjuster 380 amplifies the gain by 6 dB. As a result, an operating point in the AGC of the receiving device 200 does not change. The gain adjusting circuits 310 and 330, the adjustment amplifier 320, and the gain adjuster 380 are one example of an adjusting section set forth in the claims.

Although the resistors are switched by the switches in the gain adjusting circuits 310 and 330 and the voltage dividing circuit 340, part or all of them may be replaced by an element other than a resistor as long as the combined resistance can be controlled. For example, a resistor may be replaced by a diode, and a resistor and a switch may be replaced by a transistor.

FIG. 5 is a diagram showing one example of the voltage division ratio setting table 390 in the first embodiment. In this voltage division ratio setting table 390, the voltage division ratio is retained for each combination of the signal format and the allowable voltage. For example, suppose that a maximum value of the amplitude of the output signal of the adjustment amplifier 320 before voltage division is 2 Vpp. Here, "Vpp" denotes the difference between the maximum value and a minimum value of the voltage of an AC signal.

For example, if the signal format is a single output and the allowable voltage is 2 V, the output voltage $V_3$ does not surpass the allowable voltage and therefore the voltage division ratio is set to "1." If the signal format is the single output and the allowable voltage is 1 V, the output voltage $V_3$ surpasses the allowable voltage unless voltage division is performed. Thus, a voltage division ratio of "1/2" is set.

If the signal format is a differential output and the allowable voltage is 1 V, the output voltage $V_3$ does not surpass the allowable voltage and therefore the voltage division ratio is set to "1." If the signal format is the differential output and the allowable voltage is 0.5 V, the output voltage $V_3$ surpasses the allowable voltage unless voltage division is performed. Thus, a voltage division ratio of "1/2" is set.

The allowable voltage often differs depending on the specifications of the demodulating device 400. However, setting various kinds of allowable voltages in the voltage division ratio setting table 390 allows the connection to various kinds of demodulating devices 400, which enhances the versatility of the receiving device 200.

[Configuration Example of Gain Controller]

Figure 6:
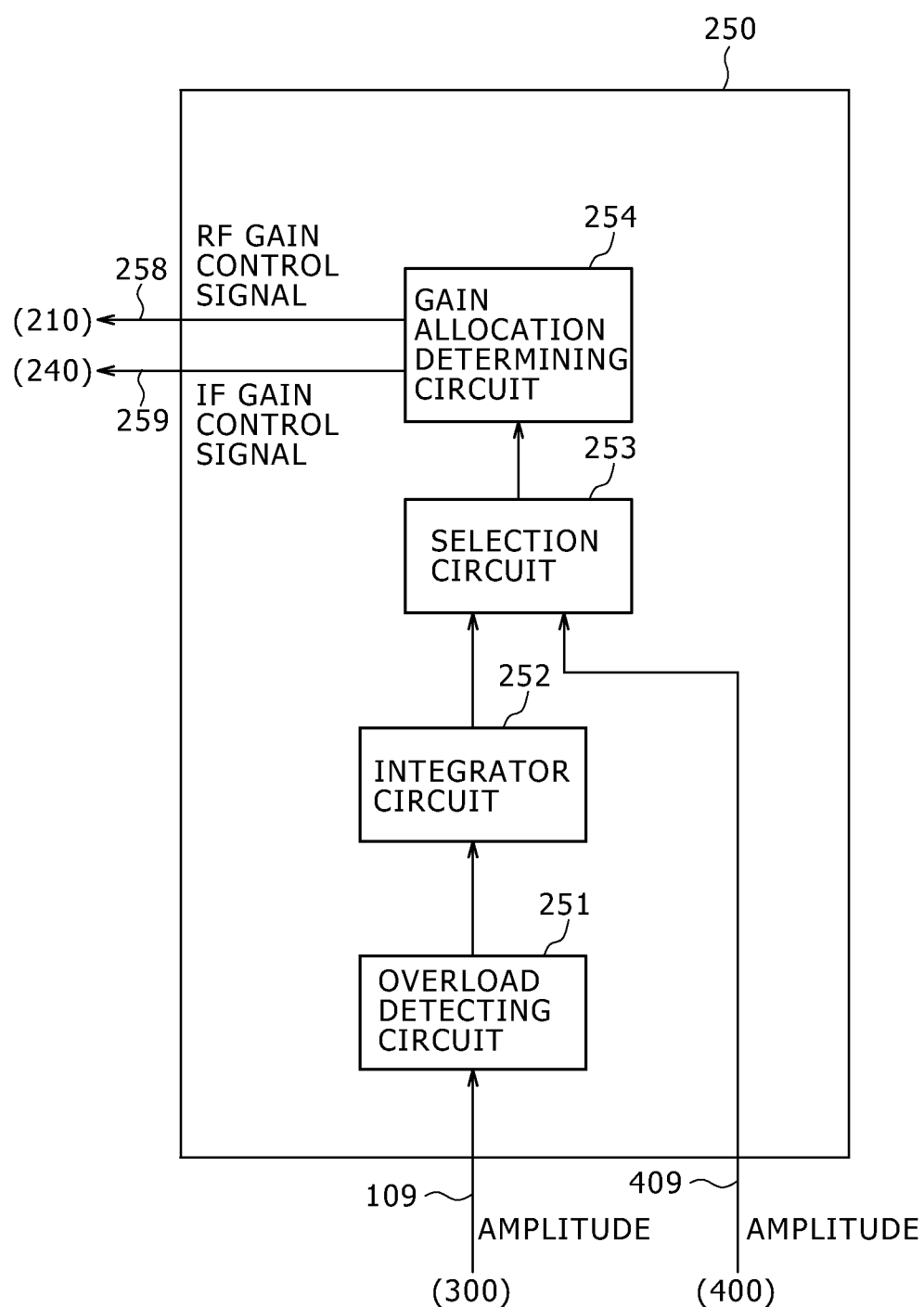
FIG. 6 is a block diagram showing one configuration example of a gain controller in the first embodiment.

FIG. 6 is a block diagram showing one configuration example of the gain controller 250 in the first embodiment. This gain controller 250 includes an overload detecting circuit 251, an integrator circuit 252, a selection circuit 253, and a gain allocation determining circuit 254.

The overload detecting circuit 251 detects the output signal from the receiving device 200. If the amplitude of the output signal from the receiving device 200 is equal to or larger than a predetermined threshold, the overload detecting circuit 251 supplies this output signal to the integrator circuit 252. An interfering signal that deteriorates the received signal quality is detected by the overload detecting circuit 251.

The integrator circuit 252 integrates the signal from the overload detecting circuit 251. The integrator circuit 252 outputs the integrated signal to the selection circuit 253. The response speed (time constant) in the integrator circuit 252 is optimized based on the frequency of the received signal.

The selection circuit 253 selects the signal with the larger amplitude from the signal from the integrator circuit 252 and the signal from the demodulating device 400. The selection circuit 253 supplies the selected signal to the gain allocation determining circuit 254.

Based on the amplitude of the signal from the selection circuit 253, the gain allocation determining circuit 254 determines the allocation of the gain of each of the RF variable gain amplifier 210 and the IF variable gain amplifier 240 in such a manner that the amplitude of this signal is kept constant. For example, if the amplitude of the received signal is comparatively small, the gain allocation determining circuit 254 does not decrease the gain of the RF variable gain amplifier 210 and preferentially decreases the gain of the IF variable gain amplifier 240. If the amplitude of the received signal is comparatively large, the gain allocation determining circuit 254 does not change the gain of the IF variable gain amplifier 240 and preferentially decreases the gain of the RF variable gain amplifier 210. The gain allocation determining circuit 254 outputs the RF gain control signal and the IF gain control signal to the RF variable gain amplifier 210 and the IF variable gain amplifier 240 based on the determined allocation. As described above, the amplitude limiter 300 performs voltage division in amplitude limitation and thus the gain is lowered. However, simultaneously the gain is raised by a factor corresponding to the lowering. Therefore, there is no influence of the voltage division on the gain allocation in the gain allocation determining circuit 254.

Figure 7:
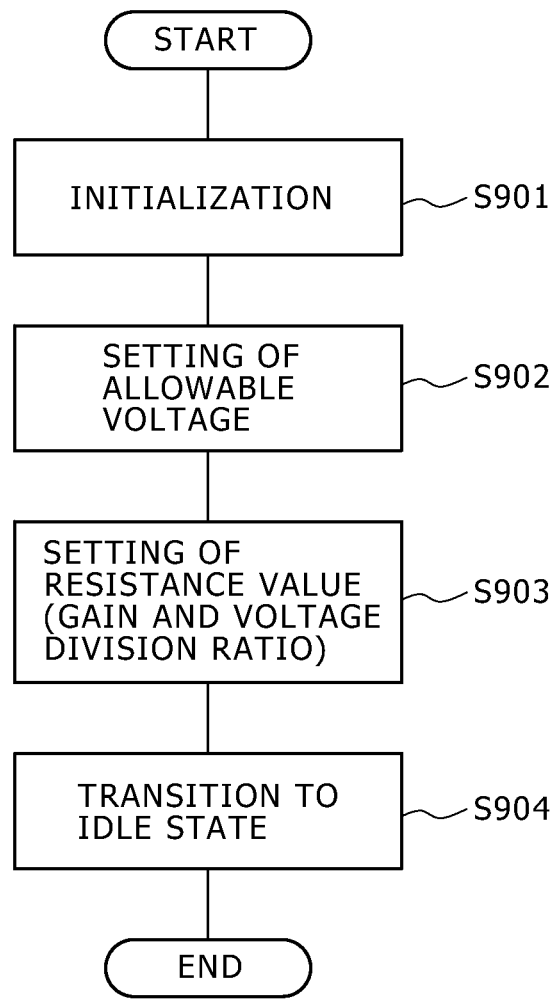
FIG. 7 is a flowchart showing one example of initial setting processing of the receiving system in the first embodiment.

FIG. 7 is a flowchart showing one example of initial setting processing in the first embodiment. This initial setting processing is started when the power of the receiving system is activated, for example.

The receiving device 200 and the demodulating device 400 execute predetermined initialization processing (step S901). When an allowable voltage is input by e.g. a setting person or a host device connected to the receiving system, the receiving device 200 sets this allowable voltage (step S902). The receiving device 200 sets the gain and the voltage division ratio by setting a resistance value corresponding to the set allowable voltage in the amplitude limiter 300 (step S903). The receiving device 200 and the demodulating device 400 make transition to an idle state in which receiving operation can be started (step S904). After the step S904, the receiving system completes the initial setting processing.

As above, according to the first embodiment of the present technique, the output voltage is divided by the voltage dividing circuit 340 according to the ratio between the maximum voltage of the voltage $V_2$ of the adjustment amplifier 320 and the allowable voltage and the voltage $V_2$ is amplified according to this ratio. This can protect the apparatus with keeping of the operating point.

<2. Second Embodiment>
[Configuration Example of Receiving System]

Figure 8:
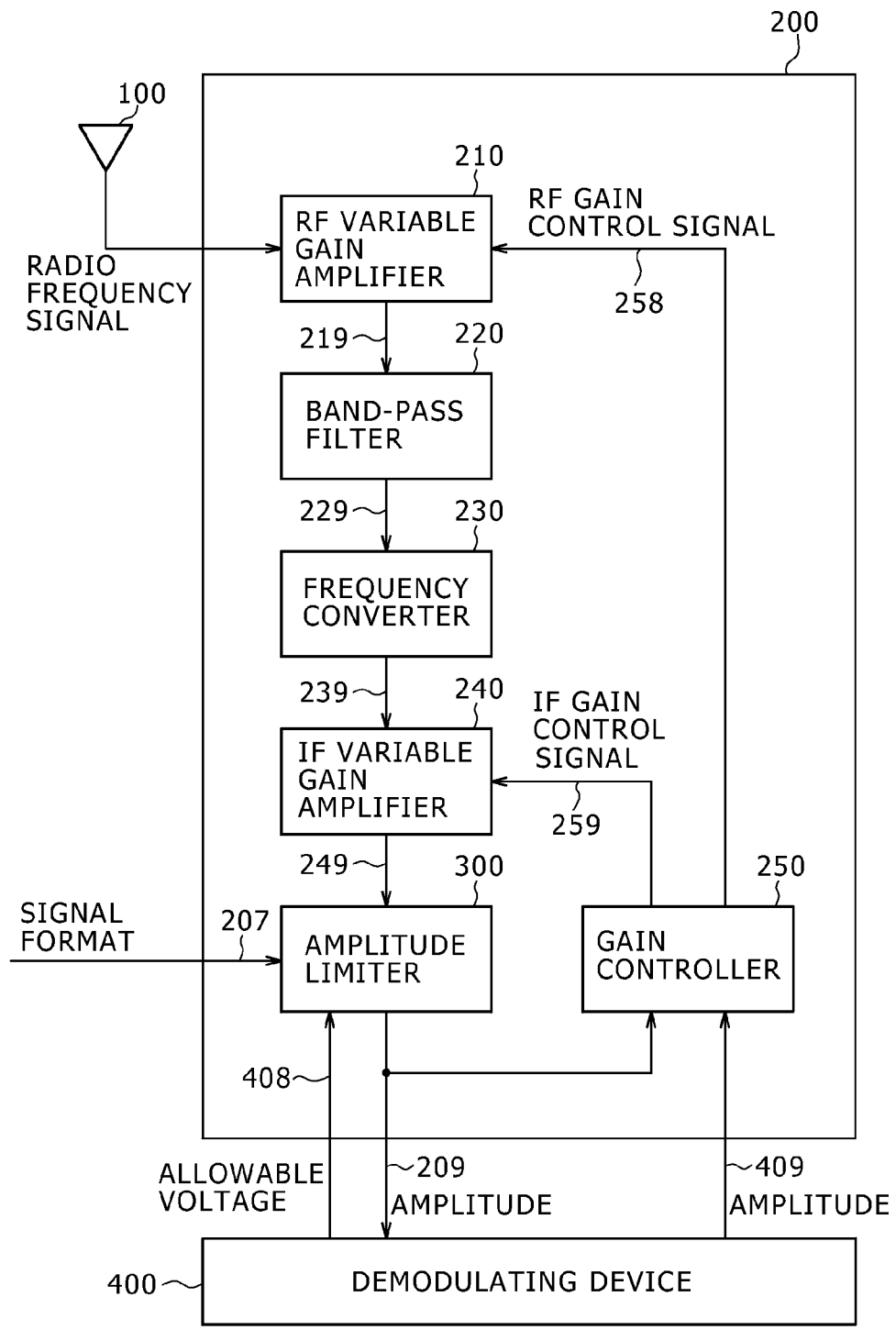
FIG. 8 is a block diagram showing one configuration example of a receiving system in a second embodiment.

FIG. 8 is a block diagram showing one configuration example of a receiving system in a second embodiment. The first embodiment has the configuration in which the allowable voltage is set in advance. However, the receiving device 200 may receive the value of the allowable voltage from the demodulating device 400. The amplitude limiter 300 in the receiving system of the second embodiment is different from the first embodiment in that it receives the value of the allowable voltage from the demodulating device 400. The demodulating device 400 of the second embodiment is different from the first embodiment in that it stores the allowable voltage in a memory or the like for example and notifies this allowable voltage to the receiving device 200 at predetermined timing. For example, the demodulating device 400 notifies the allowable voltage when detecting power activation of the receiving device 200 or when detecting the connection of the power-activated receiving device 200 to the demodulating device 400.

Figure 9:
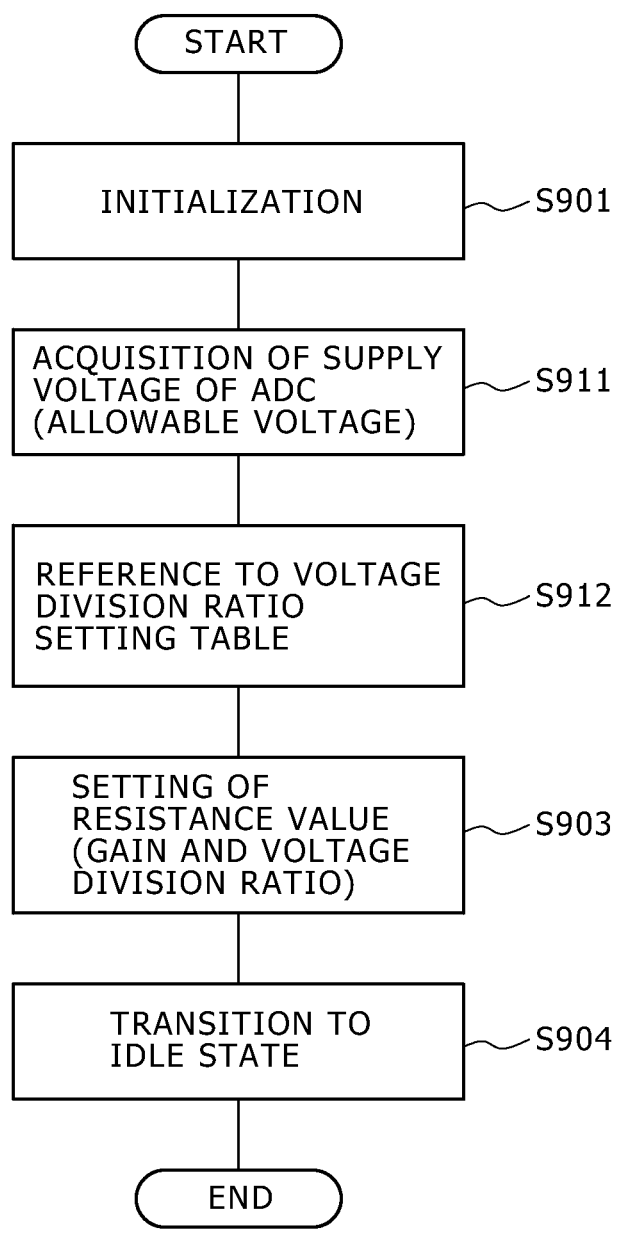
FIG. 9 is a flowchart showing one example of initial setting processing of the receiving system in the second embodiment.

FIG. 9 is a flowchart showing one example of initial setting processing in the second embodiment. The initial setting processing of the second embodiment is different from the first embodiment in that steps S911 and S912 are carried out instead of the step S902.

After the initialization processing (step S901), the receiving device 200 acquires the value of the allowable voltage. For example, the supply voltage of an analog-to-digital converter (ADC) of the demodulating device 400 is acquired as the allowable voltage (Step S911). The receiving device 200 refers to the voltage division ratio setting table 390 to read out the voltage division ratio corresponding to the allowable voltage (step S912). The receiving system carries out operation of the step S903 and the subsequent steps.

As above, according to the second embodiment of the present technique, the receiving device 200 receives the value of the allowable voltage from the demodulating device 400. This allows the IF signal to be supplied to the demodulating device 400 without setting the allowable voltage in advance.

<3. Third Embodiment>
[Configuration Example of Receiving System]

Figure 10:
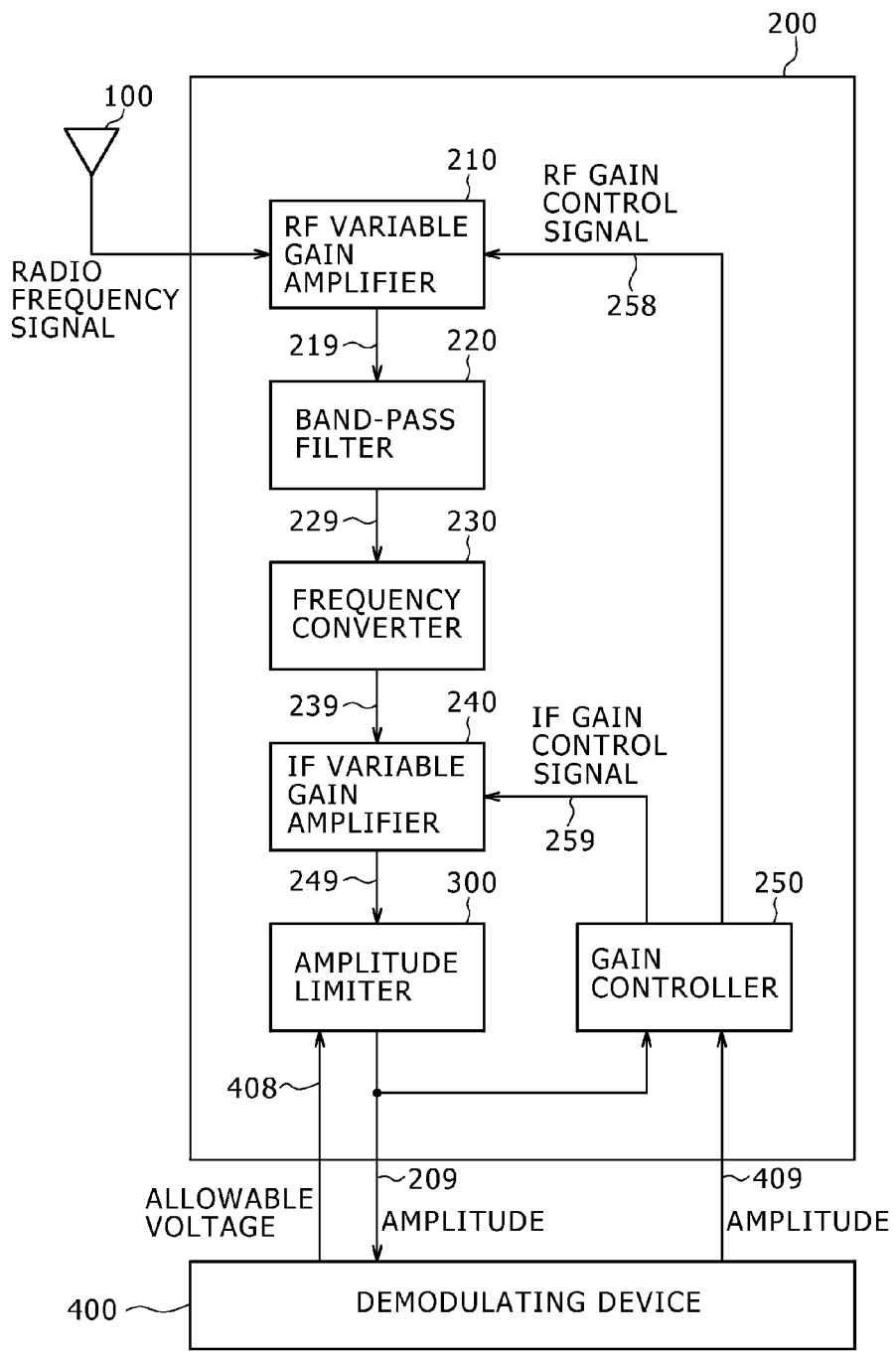
FIG. 10 is a block diagram showing one configuration example of a receiving system in a third embodiment.

FIG. 10 is a block diagram showing one configuration example of a receiving system in a third embodiment. In the first embodiment, the receiving device 200 can output a signal in both signal formats of single output signal and differential output signal. However, it may output a signal in only either one output format. The receiving device 200 in the receiving system of the third embodiment is different from the first embodiment in that it outputs only a single output signal. Because only a signal of one signal format is output, the signal format does not need to be set in the amplitude limiter 300 of the third embodiment.

Figure 11:
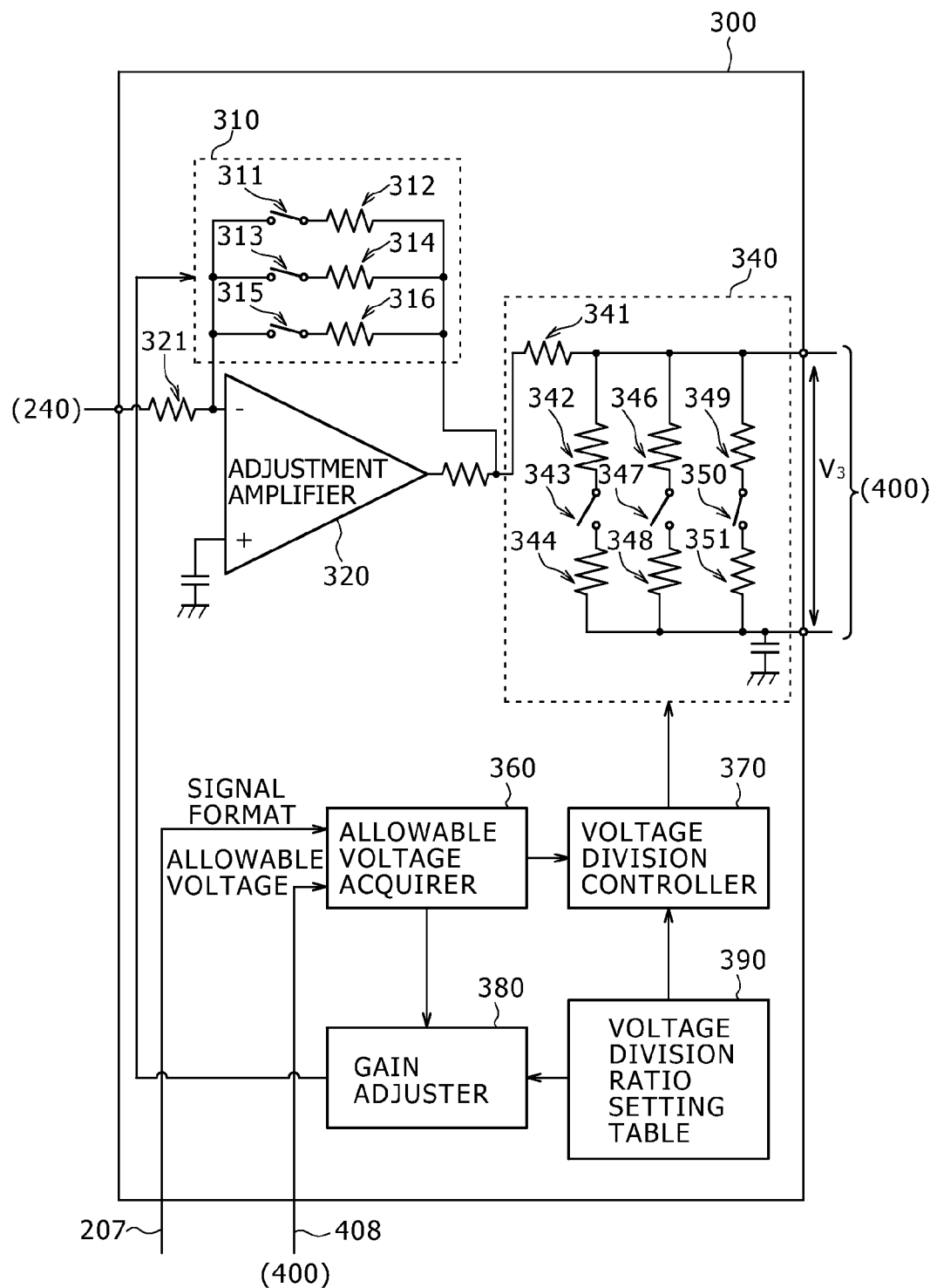
FIG. 11 is a block diagram showing one configuration example of an amplitude limiter in the third embodiment.

FIG. 11 is a block diagram showing one configuration example of the amplitude limiter 300 in the third embodiment. The amplitude limiter 300 of the third embodiment is different from the first embodiment in that it does not include the resistor 322, the gain adjusting circuit 330, and the resistor 345.

As above, according to the third embodiment of the present technique, the configuration is so made that the receiving device 200 outputs only a single output signal. This makes it possible to increase the gain and perform voltage division with a simple circuit configuration.

<4. Fourth Embodiment>
[Configuration Example of Receiving System]

FIG. 12 is a block diagram showing one configuration example of the amplitude limiter 300 in a fourth embodiment. The first embodiment has the configuration in which the allowable voltage is set in advance. However, the receiving device 200 may measure the allowable voltage. The amplitude limiter 300 in the receiving device 200 of the fourth embodiment is different from the first embodiment in that it measures the allowable voltage.

Specifically, the amplitude limiter 300 includes an allowable voltage measurer 361 instead of the allowable voltage acquirer 360. The allowable voltage measurer 361 measures the voltage of the demodulating device 400 connected to the amplitude limiter 300 as the allowable voltage before the receiving device 200 receives an RF signal. The allowable voltage measurer 361 performs analog-to-digital (A/D) conversion of the measured allowable voltage according to need and supplies it to the voltage division controller 370 and the gain adjuster 380.

FIG. 13 is a flowchart showing one example of initial setting processing in the fourth embodiment. The initial setting processing of the fourth embodiment is different from the second embodiment in that a step S921 is carried out instead of the step S911.

After the initialization processing (step S901), the receiving device 200 measures the allowable voltage. For example, a common voltage of the demodulating device 400 is measured as the allowable voltage (step S921). The receiving system carries out operation of the step S912 and the subsequent steps.

As above, according to the fourth embodiment of the present technique, the receiving device 200 measures the allowable voltage. This allows the IF signal to be supplied to the demodulating device 400 without setting the allowable voltage.

It is also possible for the present technique to take the following configurations.

(1) A gain control circuit including:
an amplifying section configured to amplify an input voltage in such a manner that amplitude of an output voltage at an output terminal is kept constant;
an allowable voltage acquirer configured to acquire an allowable voltage of an apparatus connected to the output terminal;
a voltage divider configured to divide the output voltage according to a ratio between a maximum voltage of the amplified input voltage and the allowable voltage; and
an adjusting section configured to further amplify the amplified input voltage according to the ratio and supply a resulting voltage to the output terminal.

(2) The gain control circuit according to the above-described (1), in which the allowable voltage acquirer measures a voltage of the output terminal as the allowable voltage.

(3) The gain control circuit according to the above-described (1) or (2), further including
a table configured to retain the allowable voltage and the ratio in association with each other,
in which the voltage divider reads out the ratio corresponding to the acquired allowable voltage from the table and divides the output voltage according to the ratio.

(4) The gain control circuit according to the above-described (3), in which
the table further retains a signal format indicating whether or not the output voltage is a voltage of a differential output signal in association with the allowable voltage and the ratio, and
the voltage divider reads out the ratio corresponding to the signal format and the allowable voltage.

(5) The gain control circuit according to any of the above-described (1) to (4), in which the voltage divider divides the output voltage by insertion of a resistor.

(6) The gain control circuit according to any of the above-described (1) to (5), in which the adjusting section includes
an adjustment amplifier that amplifies the amplified input voltage, and
a gain adjuster that adjusts a gain of the adjustment amplifier by changing a resistance value of a resistor connected to the adjustment amplifier according to the ratio.

(7) A receiving device including:
an amplifying section configured to amplify an input voltage in such a manner that amplitude of an output voltage at an output terminal is kept constant;
an allowable voltage acquirer configured to acquire an allowable voltage of an apparatus connected to the output terminal;
a voltage divider configured to divide the output voltage according to a ratio between a maximum voltage of the amplified input voltage and the allowable voltage; and
an adjusting section configured to further amplify the amplified input voltage according to the ratio and supply a resulting voltage to the output terminal.

(8) A receiving system including:
a gain control circuit configured to include
an amplifying section that amplifies an input voltage on which a received signal is superimposed in such a manner that amplitude of an output voltage at an output terminal is kept constant in response to input of the input voltage,
an allowable voltage acquirer that acquires an allowable voltage of an apparatus connected to the output terminal,
a voltage divider that divides the output voltage according to a ratio between a maximum voltage of the amplified input voltage and the allowable voltage, and
an adjusting section that further amplifies the amplified input voltage according to the ratio and supplies a resulting voltage to the output terminal; and
a signal processing device configured to process the received signal superimposed on the output voltage.

The present disclosure contains subject matter related to that disclosed in Japanese Priority Patent Application JP 2012-107313 filed in the Japan Patent Office on May 9, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A gain control circuit comprising:
an amplifying section configured to amplify an input voltage in such a manner that amplitude of an output voltage at an output terminal is kept constant;
an allowable voltage acquirer configured to acquire an allowable voltage of an apparatus connected to the output terminal;
a voltage divider configured to divide the output voltage according to a ratio between a maximum voltage of the amplified input voltage and the allowable voltage; and
an adjusting section configured to further amplify the amplified input voltage according to the ratio and supply a resulting voltage to the output terminal.

2. The gain control circuit according to claim 1, wherein the allowable voltage acquirer measures a voltage of the output terminal as the allowable voltage.

3. The gain control circuit according to claim 1, further comprising
a table configured to retain the allowable voltage and the ratio in association with each other,
wherein the voltage divider reads out the ratio corresponding to the acquired allowable voltage from the table and divides the output voltage according to the ratio.

4. The gain control circuit according to claim 3, wherein
the table further retains a signal format indicating whether or not the output voltage is a voltage of a differential output signal in association with the allowable voltage and the ratio, and
the voltage divider reads out the ratio corresponding to the signal format and the allowable voltage.

5. The gain control circuit according to claim 1, wherein the voltage divider divides the output voltage by insertion of a resistor.

6. The gain control circuit according to claim 1, wherein the adjusting section includes
an adjustment amplifier that amplifies the amplified input voltage, and
a gain adjuster that adjusts a gain of the adjustment amplifier by changing a resistance value of a resistor connected to the adjustment amplifier according to the ratio.

7. A receiving device comprising:
an amplifying section configured to amplify an input voltage in such a manner that amplitude of an output voltage at an output terminal is kept constant;
an allowable voltage acquirer configured to acquire an allowable voltage of an apparatus connected to the output terminal;

a voltage divider configured to divide the output voltage according to a ratio between a maximum voltage of the amplified input voltage and the allowable voltage; and an adjusting section configured to further amplify the amplified input voltage according to the ratio and supply a resulting voltage to the output terminal.

8. A receiving system comprising:

a gain control circuit configured to include

- an amplifying section that amplifies an input voltage on which a received signal is superimposed in such a manner that amplitude of an output voltage at an output terminal is kept constant in response to input of the input voltage,
- an allowable voltage acquirer that acquires an allowable voltage of an apparatus connected to the output terminal,
- a voltage divider that divides the output voltage according to a ratio between a maximum voltage of the amplified input voltage and the allowable voltage, and
- an adjusting section that further amplifies the amplified input voltage according to the ratio and supplies a resulting voltage to the output terminal; and a signal processing device configured to process the received signal superimposed on the output voltage.

* * * * *